US012772509B2

(12) United States Patent
Mehrotra et al.

(10) Patent No.: US 12,772,509 B2
(45) Date of Patent: Oct. 20, 2026

(54) ISOLATION STRUCTURE COMPRISING A FIRST DOPED BURIED LAYER SURROUNDED AT LEAST IN PART BY ANOTHER DOPED BURIED LAYER OF THE SAME CONDUCTIVITY TYPE AND A TRENCH ISOLATION STRUCTURE FOR AN ACTIVE COMPONENT

(71) Applicant: NXP B.V., Eindhoven (NL)

(72) Inventors: Saumitra Raj Mehrotra, Scottsdale, AZ (US); Ronghua Zhu, Chandler, AZ (US); Todd Roggenbauer, Austin, TX (US)

(73) Assignee: NXP B.V., Eindhoven (NL)

( * ) Notice: Subject to any disclaimer, the term of this patent is extended or adjusted under 35 U.S.C. 154(b) by 449 days.

(21) Appl. No.: 18/473,950

(22) Filed: Sep. 25, 2023

(65) Prior Publication Data

US 2024/0128316 A1 Apr. 18, 2024

(30) Foreign Application Priority Data

Oct. 13, 2022 (EP) .................................... 22201462

(51) Int. Cl.

*H10D 62/10* (2025.01)
*H10W 10/00* (2026.01)
*H10W 10/17* (2026.01)

(52) U.S. Cl.

CPC ......... *H10D 62/115* (2025.01); *H10D 62/107* (2025.01); *H10W 10/014* (2026.01); *H10W 10/17* (2026.01)

(58) Field of Classification Search

CPC ................ H10D 62/115; H10D 62/107; H01L 21/76224; H01L 21/763; H01L 21/761;

(Continued)

(56) References Cited

U.S. PATENT DOCUMENTS 7,608,908 B1 10/2009 Khemka et al.
8,502,308 B2 8/2013 Schrems et al.

(Continued)

FOREIGN PATENT DOCUMENTS

CN 104362095 2/2015
EP 3553822 10/2019

OTHER PUBLICATIONS

Hee-dae Kim€et al., "Process-induced charge trapping and junction breakdown instability in deep trench isolation for high voltage Smart Power IC process," €2012 IEEE International Conference on Electron Devices and Solid State Circuit (EDSSC), Bangkok, Thailand, 2012, pp. 1-4.

*Primary Examiner* — William B Partridge
*Assistant Examiner* — Ilker Ozden

(57) ABSTRACT

A semiconductor device comprising a substrate having a first conductivity type, the substrate having a top surface and a bottom surface, a first buried layer disposed in the substrate at a first depth from the top surface, wherein the first buried layer has a second conductivity type and a first doping concentration, a second buried layer adjacent and surrounding the first buried layer at the first depth, wherein the second buried layer has the second conductivity type and a second doping concentration, wherein the second doping concentration is less than the first doping concentration, and an isolation trench disposed in the substrate and surrounding the second buried layer, wherein the isolation trench extends from the top surface of the substrate to a second depth, the second depth exceeding the first depth.

18 Claims, 5 Drawing Sheets

(58) Field of Classification Search
CPC . H10W 10/014; H10W 10/17; H10W 10/041; H10W 10/40; H10W 10/30; H10W 10/031
See application file for complete search history.

(56) References Cited

U.S. PATENT DOCUMENTS

| | | | | |
|---|---|---|---|---|
| 9,343,526 | B2 | 5/2016 | Cheng et al. | |
| 9,673,084 | B2 | 6/2017 | Liu et al. | |
| 2007/0063274 | A1 | 3/2007 | Kanda et al. | |
| 2013/0072004 | A1* | 3/2013 | Tsuchiko | H10D 10/051 438/495 |
| 2015/0137327 | A1* | 5/2015 | Lin | H01L 21/743 257/621 |
| 2016/0079345 | A1* | 3/2016 | Vanhoucke | H10D 62/109 438/335 |
| 2016/0181421 | A1* | 6/2016 | Yang | H10D 30/655 438/151 |
| 2016/0254347 | A1* | 9/2016 | Tsuchiko | H10D 84/0191 257/545 |
| 2017/0148873 | A1* | 5/2017 | Kim | H10D 62/113 |
| 2018/0286853 | A1* | 10/2018 | Mallikarjunaswamy | H10D 89/711 |
| 2020/0194581 | A1* | 6/2020 | Kan | H10D 30/603 |
| 2022/0189955 | A1* | 6/2022 | Shin | H10D 30/603 |
| 2022/0190116 | A1 | 6/2022 | Dutta et al. | |
| 2024/0047460 | A1* | 2/2024 | Liao | H01L 21/761 |

* cited by examiner

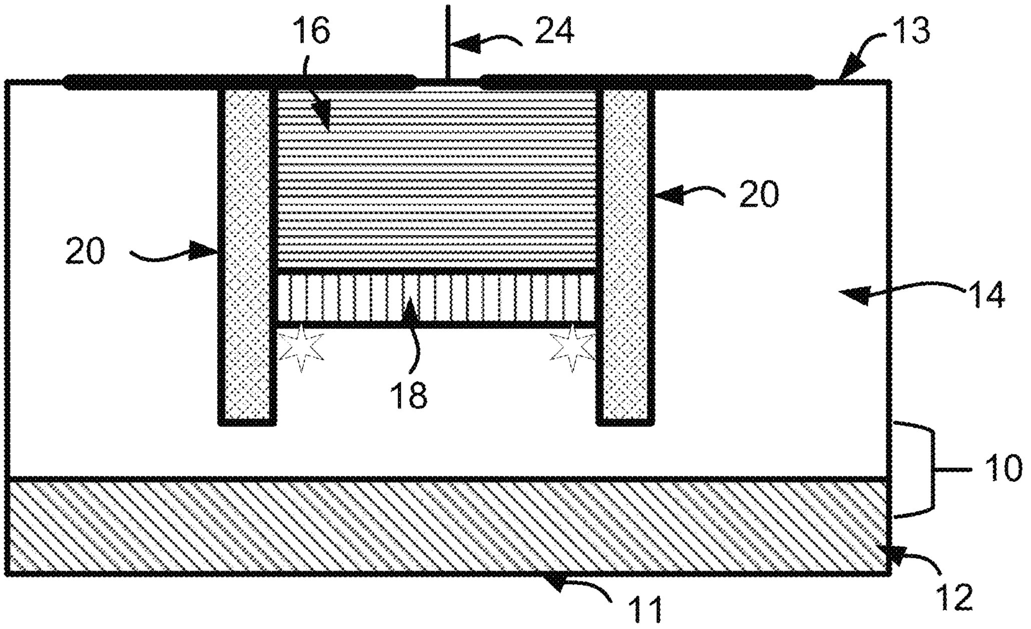
Fig. 1 -PRIOR ART
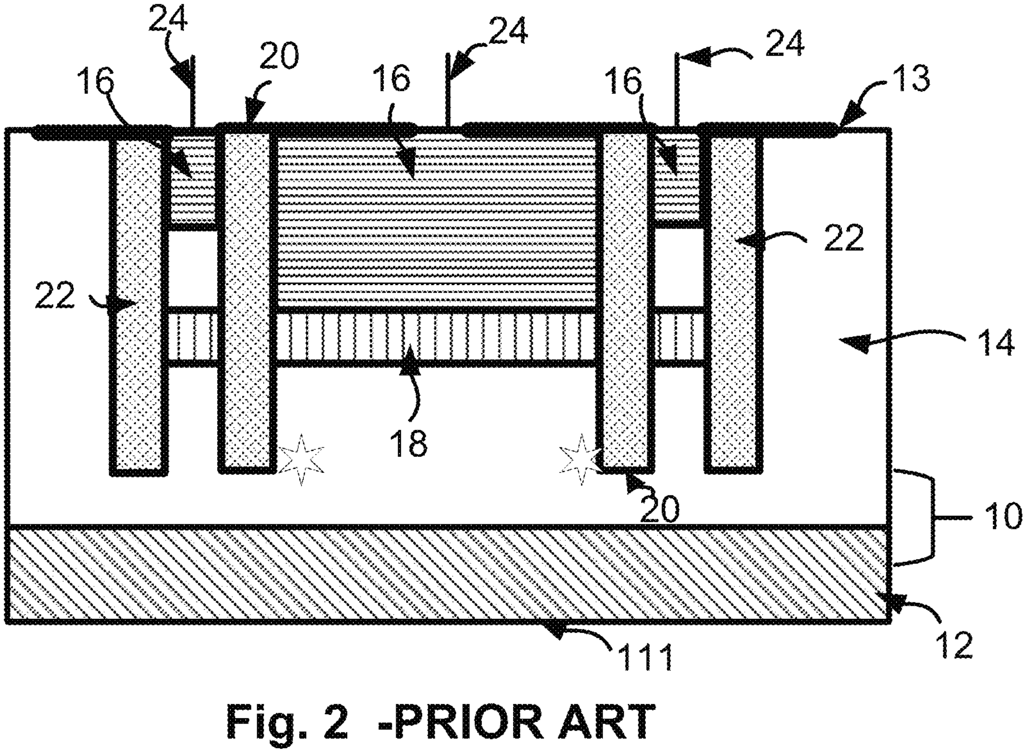
Fig. 2 -PRIOR ART

ISOLATION STRUCTURE COMPRISING A FIRST DOPED BURIED LAYER SURROUNDED AT LEAST IN PART BY ANOTHER DOPED BURIED LAYER OF THE SAME CONDUCTIVITY TYPE AND A TRENCH ISOLATION STRUCTURE FOR AN ACTIVE COMPONENT

CROSS-REFERENCE TO RELATED APPLICATIONS

This application claims priority under 35 U.S.C. § 119 to European patent application no. 22201462.3 filed Oct. 13, 2022, the contents of which are incorporated by reference herein.

BACKGROUND

The present specification relates to isolation structures for an active component in a semiconductor device. In particular, the present specification relates to trench isolation.

Bipolar CMOS DMOS (BCD) process technology enables incorporation of analog components, digital components and high voltage (HV) devices into a single chip or integrated circuit (IC). These components are designed such that they do not interfere with (for example, latch up with) adjacent components on a substrate. Hence, there is a need to properly isolate adjacent components from each other. A variety of different isolation schemes exist such as junction-based isolation or trench-based isolation in a bulk wafer or trench-based isolation in a SOI (Silicon-on-insulator) wafer.

A typical design of a trench-based isolation involves a heavily doped buried layer (BL) that intersects a trench oxide where the trench is partially or fully filled with oxide.

SUMMARY

Aspects of the present disclosure are set out in the accompanying independent and dependent claims. Combinations of features from the dependent claims may be combined with features of the independent claims as appropriate and not merely as explicitly set out in the claims.

According to a first aspect of the present disclosure, there is provided a semiconductor device comprising a substrate having a first conductivity type, the substrate having a top surface and a bottom surface. A first buried layer is disposed in the substrate at a first depth from the top surface, wherein the first buried layer has a second conductivity type and a first doping concentration. A second buried layer is adjacent to and surrounds the first buried layer at the first depth, wherein the second buried layer has the second conductivity type and a second doping concentration, wherein the second doping concentration is less than the first doping concentration. An isolation trench is disposed in the substrate and surrounds the second buried layer, wherein the isolation trench extends from the top surface of the substrate to a second depth, the second depth exceeding the first depth.

It will be appreciated that the second conductivity type is different to the first conductivity type.

The second buried layer is perimetric to the first buried layer. The isolation trench is perimetric to the second buried layer.

Optionally, the first doping concentration may be of the order of $10^{18}$/cm$^3$ or $10^{19}$/cm$^3$. Optionally, the first doping concentration may be between $5\times10^{18}$/cm$^3$ and $5\times10^{19}$/cm$^3$.

In some embodiments the first buried layer may comprise at least two doping species.

Optionally, the second doping concentration is of the order of $10^{16}$/cm$^3$ or $10^{17}$ cm$^3$. Optionally, the second doping concentration may be between $5\times10^{16}$/cm$^3$ and $5\times10^{17}$/cm$^3$.

It will be appreciated that the doping concentrations referred to in the present disclosure may be the peak doping concentration for the respective semiconductor layer.

Optionally, the substrate comprises a base substrate and at least one epitaxial layer disposed over the base substrate. The at least one epitaxial layer may have the first conductivity type. The isolation trench and the first and second buried layers may be disposed in the at least one epitaxial layer. Thus, the top surface of the substrate may be the top surface of the at least one epitaxial layer. The bottom surface of the substrate may be a bottom surface of the base substrate. It will be appreciated that various multi-layer substrates could be used.

In some embodiments, the semiconductor device further comprises a first well region disposed between the top surface of the substrate and the first buried layer. The first well region may have the second conductivity type. The first well region may be bounded by the isolation trench.

In some embodiments, the semiconductor device further comprises an active component provided in the first well region. Optionally, the active component may be a transistor, or a diode, but is not limited to these examples.

Optionally, a second well region may be disposed between the first well region and the isolation trench. The second well region may have the second conductivity type and may surround the first well region.

The second well region may be perimetric to the first well region. The isolation trench may be perimetric to the second well region.

Optionally, the second well region may have a doping concentration that is the same as, or of the same order as, the second doping concentration.

In some embodiments, the second well region may have a doping concentration that is of the order of $10^{16}$/cm$^3$.

In some embodiments, the first well region may have a doping concentration that is of the order of $10^{17}$/cm$^3$ or $10^{18}$/cm$^3$. Optionally, the first well region may have a doping concentration that is between the first doping concentration and the second doping concentration.

Optionally, a width of the second buried layer is less than a width of the first buried layer. The width of the second buried layer is the distance between the isolation trench and the first buried layer.

Optionally, a width of the second buried layer between the isolation trench and the first buried layer is at least 1 μm. Optionally, a width of the second buried layer between the isolation trench and the first buried layer is between 1 and 5 μm.

Optionally, the isolation trench contains a polysilicon material.

Optionally, the first and second buried layers have the same height.

Optionally, the second buried layer is configured such that a breakdown region is spaced from the isolation trench. The breakdown region is defined as a region or location which is susceptible to electrical breakdown due to a high electric field strength. This may also be referred to as an electrical hotspot.

Optionally, the second buried layer is configured such that the breakdown region is located proximate a junction between the first buried layer and the second buried layer.

Optionally, the second buried layer is configured such that the breakdown region is located proximate an edge of the first buried layer.

Thus, the breakdown region may be spaced from the trench by a distance equal to the width of the second buried layer.

According to a second aspect of the present disclosure, there is provided a method of manufacturing a semiconductor device, comprising providing a substrate having a first conductivity type, the substrate having a top surface and a bottom surface, providing a first buried layer in the substrate at a first depth from the top surface, wherein the first buried layer has a second conductivity type and a first doping concentration, providing a second buried layer adjacent and surrounding the first buried layer at the first depth, wherein the second buried layer has the second conductivity type and a second doping concentration, wherein the second doping concentration is less than the first doping concentration, and providing an isolation trench in the substrate surrounding the second buried layer, wherein the isolation trench extends from the top surface of the substrate to a second depth, the second depth exceeding the first depth.

It will be appreciated that the method may comprise method steps for manufacturing a semiconductor device according to any embodiment or example of the first aspect of the disclosure.

Optionally, the first and second buried layers may be inserted or implanted in a single step.

Optionally, the method may include providing a first well region between the top surface of the substrate and the first buried layer. The first well region may have the second conductivity type.

Optionally, the method may include providing a second well region between the isolation trench and the first well region, such that the second well region surrounds or is perimetric to the first well region. The second well region may have the second conductivity type. The second well region may have a lower doping concentration than the first well region.

Optionally, the first and second well regions may be inserted or implanted in a single step. Optionally, the first and second well regions may be inserted or implanted before the isolation trench is provided.

The method may include providing a polysilicon material in the isolation trench.

The method may comprise providing a base substrate, the base substrate having the first conductivity type. The method may comprise providing a first epitaxial layer over the base substrate, the first epitaxial layer having the first conductivity type.

The method may include implanting the first and second buried layers into the first epitaxial layer. A second epitaxial layer may be grown over the first epitaxial layer and the first and second buried layers.

BRIEF DESCRIPTION OF THE DRAWINGS

Illustrative embodiments of this disclosure will be described hereinafter, by way of example only, with reference to the accompanying drawings in which like reference signs relate to like elements and in which:

FIG. 1—shows a cross-sectional view of a prior art semiconductor device;

FIG. 2—shows a cross-sectional view of another prior art semiconductor device;

DETAILED DESCRIPTION

Figure 3:
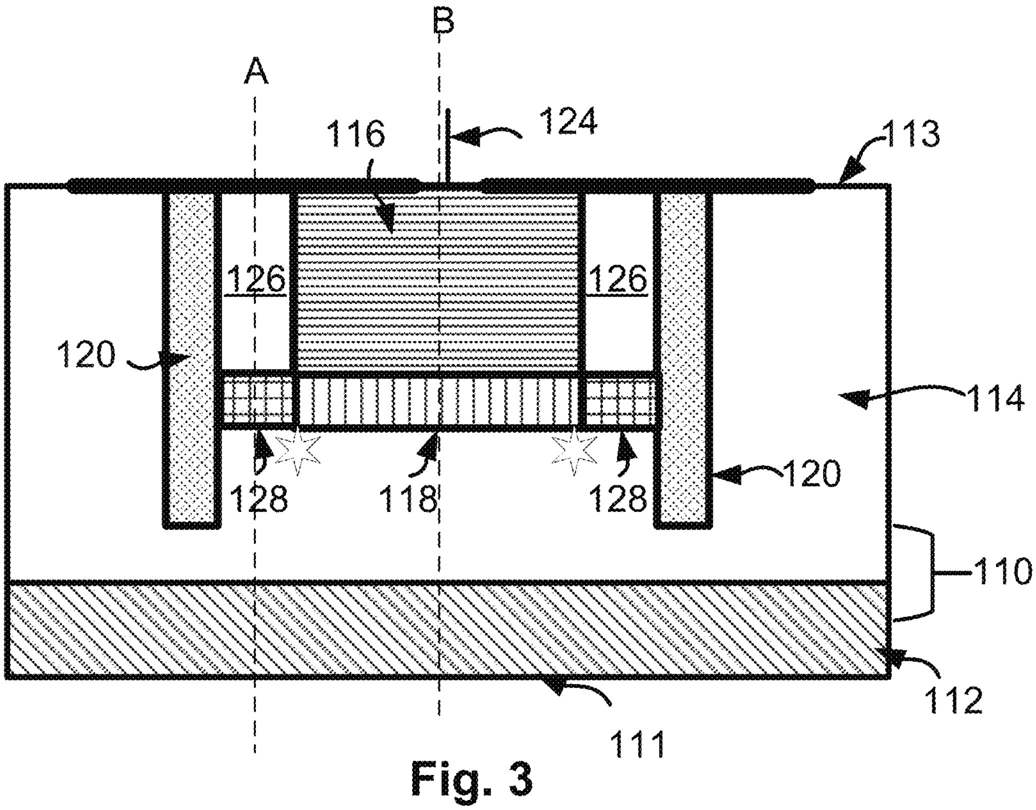
FIG. 3—shows a cross-sectional view of a semiconductor device according to an embodiment of the present disclosure.

Embodiments of this disclosure are described in the following with reference to the accompanying drawings. It will be appreciated that the drawings are schematic illustrations and are not drawn to scale.

FIG. 1 is a cross-sectional view of a prior art semiconductor device. The semiconductor device comprises a substrate 10 formed of a base substrate 12 and at least one epitaxial layer 14 formed on top of the base substrate 12. The substrate 10 has a bottom surface 11 and a top surface 13. It will be appreciated that in some embodiments the substrate 10 may be a single layer, or the substrate may have a plurality of different layers.

A heavily doped buried layer 18 is disposed in the substrate 10 at a depth from the top surface 13 of the substrate. The buried layer 18 is surrounded by an isolation trench 20. The trench 20 is usually filled with an oxide material. A well region 16 is disposed between the top surface 13 and the buried layer 18. The well region 16 is bounded by (or surrounded by) the trench 20. At least one electrical contact 24 is electrically connected to the well region 16 and the buried layer 18. The electrical contact(s) 24 control the potential of the buried layer 18.

In use (but not shown in FIG. 1) an active component is disposed in the well region 16. The isolation trench 20 and buried layer 18 are provided to attempt to electrically isolate the active component from neighbouring components on the substrate 10, such that adjacent active components do not interfere with each other. The trench 20 provides a physical barrier, due to the oxide filling, and the buried layer 18, provides an electrical barrier.

However, it has been found that the semiconductor device shown in FIG. 1 is susceptible to breakdown voltage shift over time. Avalanche breakdown occurs when an electric field generated by a voltage in a semiconducting region exceeds a critical value, such that the object becomes a conductor. This is because the electric field becomes strong enough generate a lot of electron/hole pairs that create a lot of current quickly. The breakdown voltage of an object is the voltage at which this breakdown occurs. The breakdown voltage depends on a variety of factors including the composition and shape of the object.

Accordingly, electrical breakdown usually initiates at the region that has the highest electric field. In this disclosure this region is called the breakdown region, or hotspot region, and is represented by a star in FIGS. 1 to 3.

If there is a shift in the breakdown voltage over time, this means that the voltage at which electrical breakdown occurs is not stable and changes over time. If the breakdown voltage shifts to lower voltages over time, then this can result in the isolation structure failing when the semiconductor device is subjected to high voltages.

It has been found that the breakdown voltage of the prior art in FIG. 1 shifts to lower voltages over time. This is because the breakdown region (i.e., the high electric field region at which breakdown occurs) is located proximate to the trench 20, as shown by the stars. This causes the breakdown voltage to change over time due to hot electron or hot hole injection towards the trench oxide causing Ox-Si interface charging, or possibly due to hot electron or hot hole injection landing in the conductive polysilicon region of the trench.

Another prior art example is shown in FIG. 2. Features which are common between FIGS. 1 and 2 have been given the same reference numeral. In FIG. 2, there is a second isolation trench 22 provided, which is spaced from and surrounds the first isolation trench 20. Both trenches 20, 22 intersect the buried layer 18 and at least a portion of the well region 16. The trenches 20, 22 may be filled with an oxide, or polysilicon material. Due to this dual trench structure, the high electric field region (or breakdown region) is located proximate the inner edge of the first trench 20, as shown by the stars in FIG. 2. Again, it has been found that the semiconductor device shown in FIG. 2 is susceptible to breakdown voltage (BV) shift over time. As stated above, this BV shift can be caused due to hot electron or hot hole injection towards the trench oxide causing Ox-Si interface charging, or possibly due to hot electron or hot hole injection landing in the conductive polysilicon region of the trench.

A cross-sectional view of a semiconductor device according to an embodiment of the present invention is shown in FIG. 3.

The semiconductor device comprises a substrate 110 formed of a base substrate 112 and at least one epitaxial layer 114 formed on top of the base substrate 112. The substrate 110 has a bottom surface 111 and a top surface 113. It will be appreciated that in some embodiments the substrate 110 may be a single layer, or the substrate may have a plurality of different layers. The substrate 110 has a first conductivity type, for example positive or p conductivity.

A first buried layer 118 is disposed in the substrate 110 at a depth from the top surface 113 of the substrate. The first buried layer 118 has a second conductivity type, which is different to the conductivity type of the substrate 110. The first buried layer 118 is doped at a first doping concentration.

A second buried layer 128 is disposed in the substrate 110 at the same depth as the first buried layer 118. The second buried layer 128 is adjacent to and surrounds the first buried layer 118. Thus, the second buried layer 128 is perimetric to the first buried layer 118.

The second buried layer 128 has a second conductivity type (opposite to the substrate 110 and the same as the first buried layer 118). The second buried layer 128 is doped at a second doping concentration. The second doping concentration is less than the first doping concentration. Thus, the second buried layer 128 can be referred to as a light buried layer.

An isolation trench 120 is provided that extends to a depth that exceeds the first depth of the first and second buried layers 118, 128. In some embodiments the isolation trench 120 may extend from the top surface 113 of the substrate to the base substrate 112, or to the bottom surface of the substrate 111. The trench 120 comprises a polysilicon material. The isolation trench 120 enclosed or is perimetric to the second buried layer 128.

A first well region 116 is disposed between the top surface 113 and the buried layer 118. The first well region 116 has the second conductivity type, the same as the first and second buried layers. At least one electrical contact 124 is electrically connected to the first well region 116.

A second well region 126 is provided between the isolation trench 120 and the first well region 116. The second well region 126 is therefore perimetric to the first well region, as it surrounds the perimeter of the first well region 116. The isolation trench 120 is perimetric to the second well region 126.

The second well region 126 has the second conductivity type and a doping concentration that is less than the doping concentration of the first well region 116. In some embodiments, the second well region 126 may have a doping concentration that is the same as, or of the same order as, the second buried layer 128.

In use (see FIG. 4) an active component is disposed in the first well region 116. The combination of the first well region 116, first buried layer 118 and the active component can be referred to as a high voltage (HV) tub. The structure shown in FIG. 3 is configured to electrically isolate the active component from neighbouring components on the substrate 110. Optionally, the substrate 110 may comprise a plurality of structures as shown in FIG. 3 (i.e., a plurality of isolation trenches 120, first and second buried layers 118, 128 and first and second well regions 116, 126), wherein each first well region 116 is configured to contain a respective active component. For simplicity, only a single isolation structure has been shown in FIG. 3.

The second buried layer 128 acts as a spacer between the first buried layer 118 and the isolation trench 120. In practice, this changes the location of the breakdown region, which is represented by stars in FIG. 3. As shown, the provision of the second buried layer 128 having a doping concentration that is less than the doping concentration of the first buried layer 118 spaces or translates the breakdown region away from the isolation trench 120 by a distance equal to the width of the second buried layer 128. In some embodiments, the second buried layer 128 may have a width of at least 1 μm. The second buried layer 128 may have a width equal to between 1 and 5 μm.

By moving the breakdown region away from the isolation trench 120 this reduces, or eliminates, breakdown voltage shift over time, even if the semiconductor device is exposed to high voltage and/or high temperatures for a prolonged period of time. In one particular embodiment, the breakdown voltage of the semiconductor device was tested, and the semiconductor device was then constantly stressed at 80V and 150° C. for around 1 week. The breakdown voltage was then retested and was found to be only 0.5 V different to the initial breakdown voltage. Thus, in the semiconductor device shown in FIG. 3, the breakdown voltage remains more stable or constant over time compared to the prior art devices.

Figure 4:
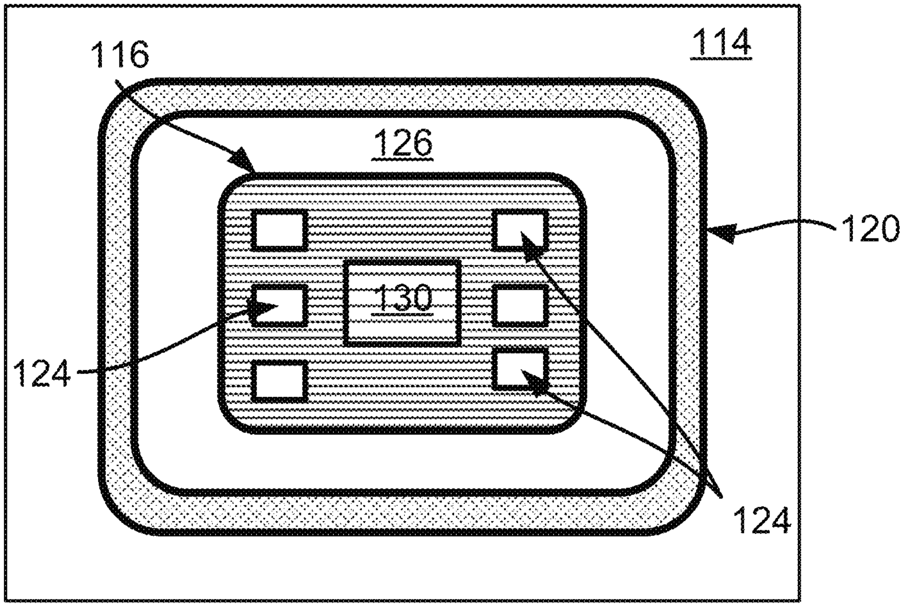
FIG. 4—shows a top view of a semiconductor device according to an embodiment of the present disclosure.

FIG. 4 shows a top view of the semiconductor device in FIG. 3 according to an embodiment of the present disclosure.

As shown, an active component 130 is positioned within the first well region 116. Although the active component 130 is shown as positioned centrally within the first well region 116 in FIG. 4, it will be appreciated that this is not limiting. The active component 130 may, for example, be a transistor or a diode, although any type of active component may be provided.

A plurality of electrical contacts 124 are provided on the top surface of the substrate in electrical contact with the first well region 116. The electrical contacts 124 control the potential of the first buried layer 118.

The second well region 126 surrounds (or is perimetric to) the first well region 116. The isolation trench 120 surrounds (or is perimetric to) the second well region 126. The at least one epitaxial layer 114 surrounds the isolation trench 120. In some embodiments, the at least one epitaxial layer 114 may be replaced by a single substrate 110. In FIG. 4, the first buried layer 118 is not visible as this is provided underneath the first well region. Similarly, the second buried layer 128 is not visible as this is provided underneath the second well region 126.

It will be appreciated that FIG. 4 is a schematic representation of a plan view of the semiconductor device, and the respective layers may have different shapes and relative sizes to those shown.

Figure 5:
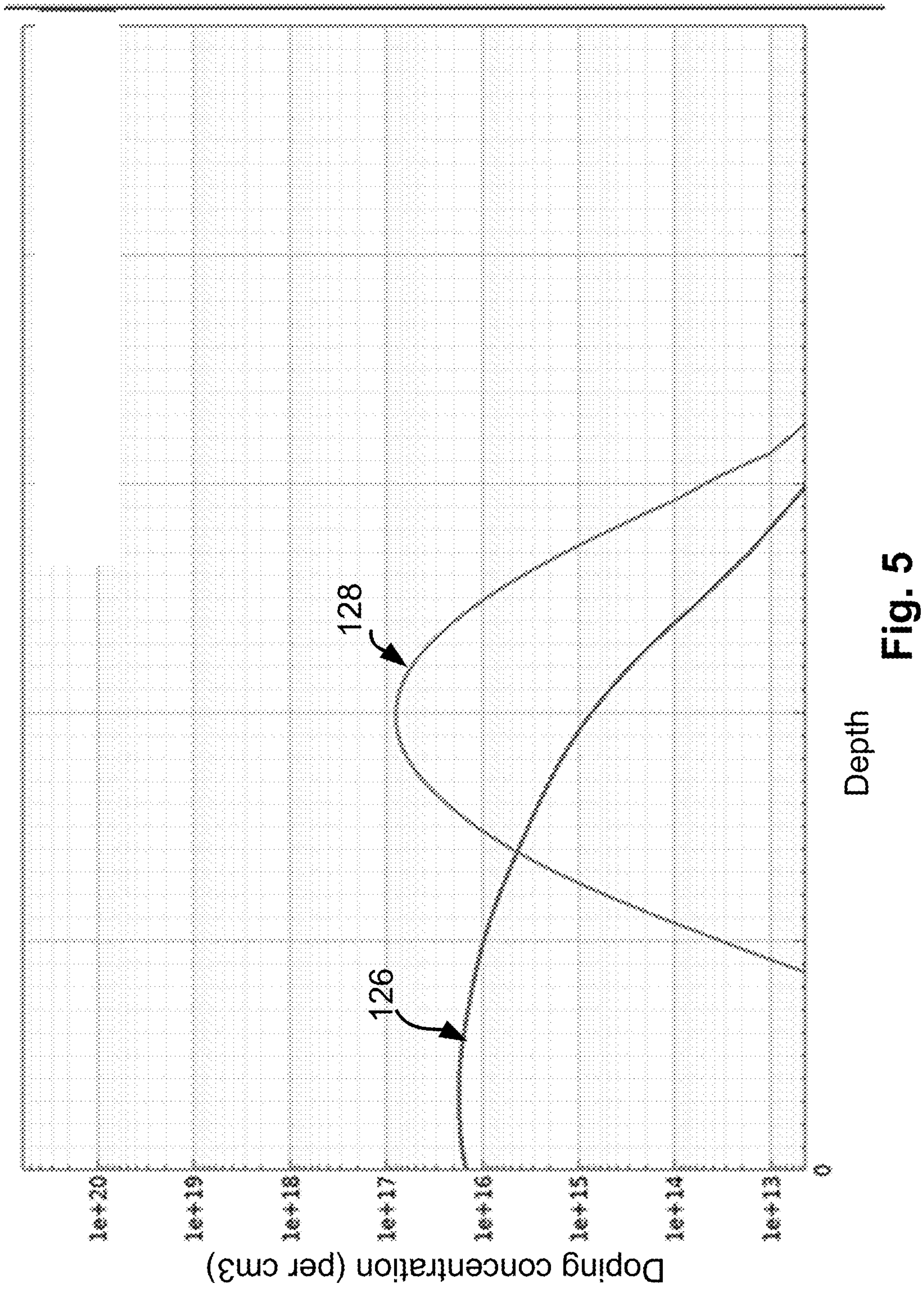
FIG. 5—is a graph showing how, in one embodiment of the present disclosure, doping concentration varies with depth along line A in FIG. 3.

FIG. 5 is a graph showing how doping concentration may vary with depth in the semiconductor along line A in FIG. 3. Accordingly, the y axis is doping concentration per cm 3, and the x axis is depth from the top surface of the substrate.

Line 126 in FIG. 5 represents the second well region 126, which in this embodiment comprises a single doping species. In this embodiment the doping species is phosphorous, although other elements may be used. As the second well region 126 is the closest to the top surface of the substrate, this layer has the highest doping concentration towards x=0 along the cross-sectional line A (see FIG. 3). In this embodiment the peak doping concentration for the second well region is off the order of $1\times10^{16}/cm^3$.

Line 128 in FIG. 5 represents the second buried layer 128. As is shown in FIG. 3, along cross-sectional line A the second buried layer 128 is positioned below (at a lower depth to) the second well region 116. In this embodiment, the second buried layer 128 comprises phosphorous, although other doping elements may be used. The peak doping concentration for the second buried layer 128 is between $1\times10^{16}/cm^3$ and $1\times10^{17}/cm^3$. As shown in FIG. 5, the peak doping concentration for the second buried layer 128 in this embodiment is close to $1\times10^{17}/cm^3$.

Figure 6:
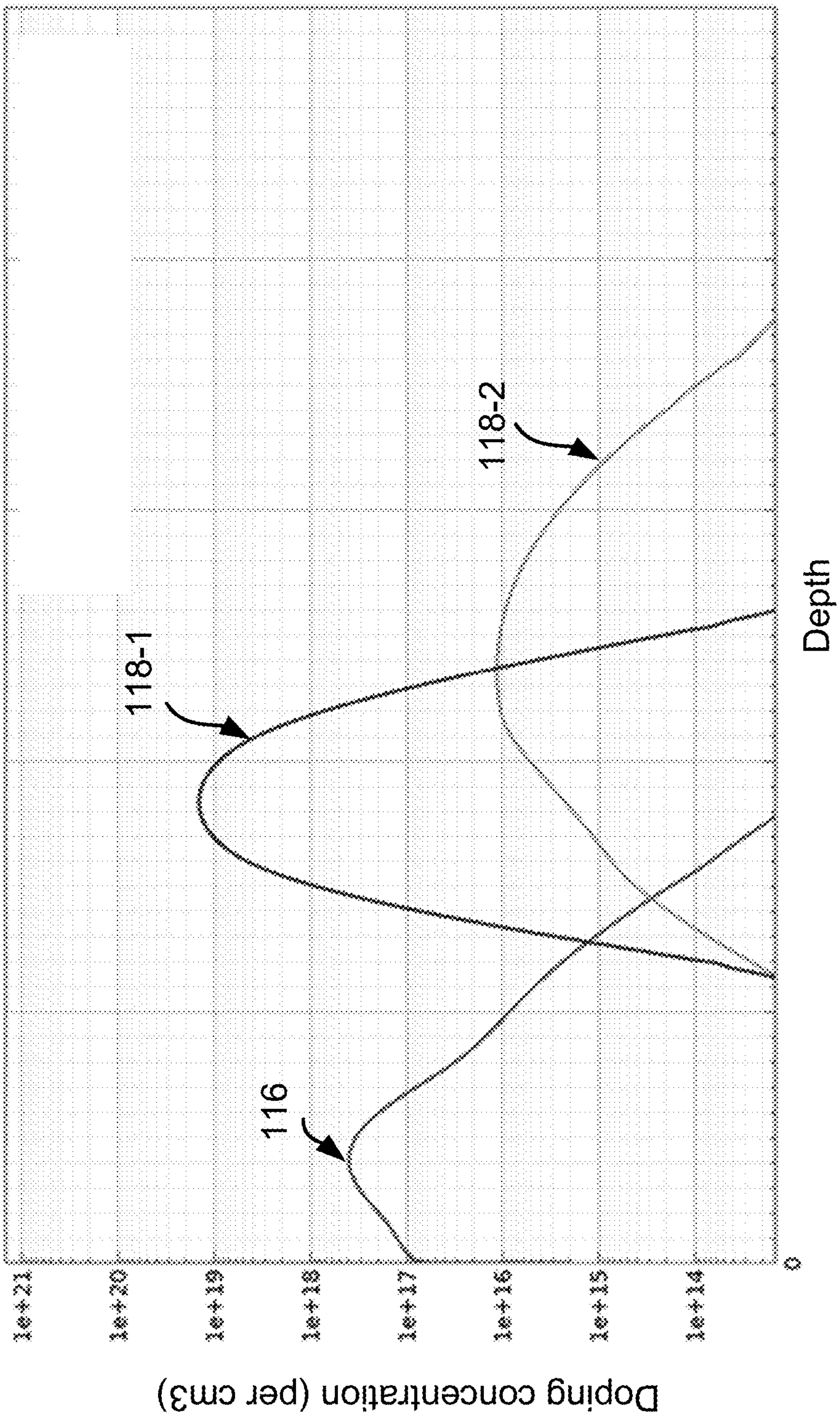
FIG. 6—is a graph showing how, in one embodiment of the present disclosure, doping concentration varies with depth along line B in FIG. 3.

FIG. 6 shows how doping concentration may vary with depth in the semiconductor along line B in FIG. 3. Accordingly, the y axis is doping concentration per cm 3, and the x axis is depth from the top surface of the substrate. Optionally, the x axis may be from 0 μm to 10 μm in both FIGS. 5 and 6, but it will be appreciated that this scale is not limiting and may vary depending on the particular application.

Line 116 in FIG. 6 represents the first well region 116, which in this embodiment comprises a single doping species, wherein the single doping species is phosphorous, although other elements may be used. As the first well region 116 is the closest to the top surface of the substrate, this layer has the highest doping concentration towards x=0 along the cross-sectional line B (see FIG. 3). In this embodiment the peak doping concentration for the first well region is between $1\times10^{17}/cm^3$ and $1\times10^{18}/cm^3$ (for example, around $5\times10^{17}/cm^3$). Accordingly, a comparison of FIGS. 5 and 6 shows that the first well region 116 has a higher peak doping concentration than the second well region 126.

In this embodiment, the first buried layer 118 is comprises two doping species, which are represented by lines 118-1 and 118-2. In this embodiment, line 118-1 represents the buried layer doped with antimony, and line 118-2 represents the buried layer doped with phosphorous. In other embodiments, different doping elements may be used and optionally only a single doping species may be used.

The antimony doped buried layer 118-1 has a peak doping concentration of the order of $1\times10^{19}/cm^3$, as shown in FIG. 6. The phosphorous doped buried layer 118-2 has a lower peak doping concentration of the order of $1\times10^{16}/cm^3$.

A comparison of FIGS. 5 and 6 shows that the peak doping concentration of the second buried layer 128 is configured to be at a slightly lower depth in the substrate than the peak doping concentration of the antimony doped buried layer 118-1. This is to mitigate the lateral electric field strength at the edge of first buried layer, which has been found to improve the stability of the breakdown voltage.

It will be appreciated that the various semiconductor layers are not limited to the doping elements or concentrations described above or shown in FIG. 5 or 6.

Figure 7:
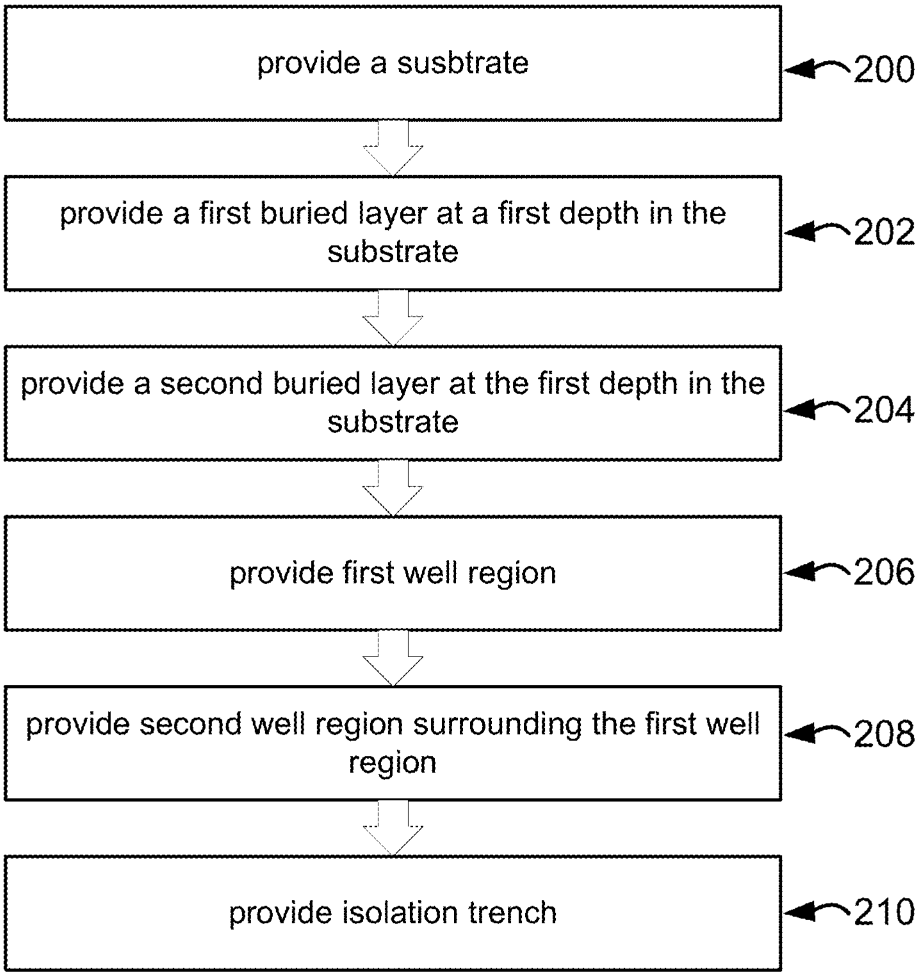
FIG. 7—is flowchart of a method of manufacture according to an embodiment of the present disclosure.

FIG. 7 is a flowchart illustrating a method of manufacturing a semiconductor device according to an embodiment of the present disclosure.

In step 200 the method comprises providing a substrate 110. The substrate 110 may have a single layer, or multiple layers. The substrate 110 may have a first conductivity type, such as but not limited to p-type or positive type conductivity.

In step 202 the method comprises providing a first buried layer 118 at a first depth within the substrate 110. The first buried layer 118 may have a second conductivity type, such as but not limited to n-type or negative type conductivity. The first buried layer 118 has a first doping concentration.

In step 204 the method comprises providing a second buried layer 128 at the first depth within the substrate 110. The second buried layer 128 may have the second conductivity type, same as the first buried layer 118. The second buried layer 128 has a second doping concentration which is less than the first doping concentration of the first buried layer 118. In some embodiments, the first doping concentration may be of the order of 1000 times higher than the second doping concentration.

It will be appreciated that steps 202 and 204 may be combined in a single step.

Optionally, the substrate 110 may be provided as a base substrate with an epitaxial layer on top. The first and second buried layers 118, 128 may be implanted in the epitaxial layer. Between steps 204 and 206 there may be an intermediate step (not shown) of growing a second epitaxial layer on top of the first epitaxial layer and the first and second buried layers 118, 128.

In step 206 the method comprises providing a first well region 116 between the first buried layer 118 and a top surface of the substrate 110 (e.g., the top surface of the second epitaxial layer). Thus, the first well region 116 is stacked on top of the first buried layer 118 when viewed from above the substrate.

In step 208 a second well region 126 is provided perimetric to (or surrounding) the first well region. The second well region 126 may be stacked on top of the second buried layer, such that it is positioned between the second buried layer 128 and the top surface of the substrate.

The first and second well regions may have the second conductivity type, the same as the first and second buried layers. The doping concentration of both the first and second well regions may be less than the first doping concentration of the first buried layer.

It will be appreciated that steps 206 and 208 may be combined in a single step.

At step 210 an isolation trench 120 is inserted into the substrate. The isolation trench 120 surrounds, or is perimetric to, the second well region 126 and the second buried layer 128. The isolation trench 120 extends to a depth within the substrate that exceeds the depth of the first and second buried layers 118, 128. The trench 120 may be filled, or partially filled, with a polysilicon material.

It will be appreciated that steps 200 to 210 could be carried out in a different order to the order shown in FIG. 7.

Accordingly, there has been described a semiconductor device comprising a substrate having a first conductivity type, the substrate having a top surface and a bottom surface, a first buried layer disposed in the substrate at a first depth from the top surface, wherein the first buried layer has a second conductivity type and a first doping concentration, a second buried layer adjacent and surrounding the first buried layer at the first depth, wherein the second buried layer has the second conductivity type and a second doping concentration, wherein the second doping concentration is less than the first doping concentration, and an isolation trench disposed in the substrate and surrounding the second buried layer, wherein the isolation trench extends from the top surface of the substrate to a second depth, the second depth exceeding the first depth. A method of manufacture is also provided, as described above.

Although particular embodiments of this disclosure have been described, it will be appreciated that many modifications/additions and/or substitutions may be made within the scope of the claims.

The invention claimed is:

1. A semiconductor device comprising:

a substrate having a first conductivity type, the substrate having a top surface and a bottom surface;

a first buried layer disposed in the substrate at a first depth from the top surface, wherein the first buried layer has a second conductivity type and a first doping concentration;

a second buried layer adjacent and surrounding the first buried layer at the first depth, wherein the second buried layer has the second conductivity type and a second doping concentration, wherein the second doping concentration is less than the first doping concentration; and an isolation trench disposed in the substrate and surrounding the second buried layer, wherein the isolation trench extends from the top surface of the substrate to a second depth, the second depth exceeding the first depth, wherein the second buried layer is configured such that a breakdown region is spaced apart from the isolation trench such that the isolation trench is not in direct contact with the breakdown region and the breakdown region is located proximate a junction between the first buried layer and the second buried layer.

2. The semiconductor device of claim 1, wherein the first doping concentration is between $5\times10^{18}/cm^3$ and $5\times10^{19}/cm^3$.

3. The semiconductor device of claim 1, wherein the second doping concentration is between $5\times10^{16}/cm^3$ and $5\times10^{17}/cm^3$.

4. The semiconductor device of claim 1, wherein the substrate comprises a base substrate and at least one epitaxial layer disposed over the base substrate, wherein the isolation trench and the first buried layer and the second buried layer are disposed in the at least one epitaxial layer.

5. The semiconductor device of claim 1, further comprising a first well region disposed between the top surface of the substrate and the first buried layer, wherein the first well region has the second conductivity type.

6. The semiconductor device of claim 5, further comprising an active component provided in the first well region.

7. The semiconductor device of claim 5, further comprising a second well region disposed between the first well region and the isolation trench, wherein the second well region has the second conductivity type and surrounds the first well region.

8. The semiconductor device of claim 7, wherein the second well region has a doping concentration that is of the same order as the second doping concentration.

9. The semiconductor device of claim 1, wherein a width of the second buried layer between the isolation trench and the first buried layer is less than a width of the first buried layer.

10. The semiconductor device of claim 9, wherein a width of the second buried layer between the isolation trench and the first buried layer is between 1 and 5 μm.

11. The semiconductor device of claim 1, wherein the isolation trench contains a polysilicon material.

12. A method of manufacturing a semiconductor device, comprising:

providing a substrate having a first conductivity type, the substrate having a top surface and a bottom surface;

providing a first buried layer in the substrate at a first depth from the top surface, wherein the first buried layer has a second conductivity type and a first doping concentration;

providing a second buried layer adjacent and surrounding the first buried layer at the first depth, wherein the second buried layer has the second conductivity type and a second doping concentration, wherein the second doping concentration is less than the first doping concentration; and providing an isolation trench in the substrate surrounding the second buried layer, wherein the isolation trench extends from the top surface of the substrate to a second depth, the second depth exceeding the first depth, wherein the second buried layer is configured such that a breakdown region is spaced apart from the isolation trench such that the isolation trench is not in direct contact with the breakdown region and the breakdown region is located proximate a junction between the first buried layer and the second buried layer.

13. The method of claim 12, wherein the first doping concentration is of the order of $10^{18}/cm^3$ or $10^{19}/cm^3$ and the second doping concentration is of the order of $10^{16}/cm^3$ or $10^{17}/cm^3$.

14. The method of claim 12, wherein a width of the second buried layer between the isolation trench and the first buried layer is less than a width of the first buried layer.

15. The method of claim 12, further comprising:

providing a first well region between the top surface of the substrate and the first buried layer, wherein the first well region has the second conductivity type.

16. The method of claim 15, further comprising:

providing a second well region between the isolation trench and the first well region, such that the second well region is perimetric to the first well region and the isolation trench is perimetric to the second well region.

17. The method of claim 16, wherein the second well region has the second conductivity type and a doping concentration that is of the same order as the second doping concentration.

18. A semiconductor device comprising:

a substrate having a first conductivity type, the substrate having a top surface and a bottom surface;

a first buried layer disposed in the substrate at a first depth from the top surface, wherein the first buried layer has a second conductivity type and a first doping concentration;

a second buried layer adjacent and surrounding the first buried layer at the first depth, wherein the second buried layer has the second conductivity type and a second doping concentration, wherein the second doping concentration is less than the first doping concentration, wherein the first and second buried layers have the same height; and an isolation trench disposed in the substrate and surrounding the second buried layer, wherein the isolation trench extends from the top surface of the substrate to a second depth, the second depth exceeding the first depth.

* * * * *